(12) United States Patent
Wisniewski et al.

(10) Patent No.: US 7,346,470 B2
(45) Date of Patent: Mar. 18, 2008

(54) SYSTEM FOR IDENTIFICATION OF DEFECTS ON CIRCUITS OR OTHER ARRAYED PRODUCTS

(75) Inventors: Mary Wisniewski, Yorktown Heights, NY (US); Emmanuel Yashchin, Yorktown Heights, NY (US); Christina Landers, Wappingers Falls, NY (US); Asya Takken, Brewster, NY (US); Brian Trapp, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/459,132

(22) Filed: Jun. 10, 2003

(65) Prior Publication Data

US 2004/0254752 A1 Dec. 16, 2004

(51) Int. Cl.
*G06F 15/00* (2006.01)
*G06F 17/50* (2006.01)

(52) U.S. Cl. .................. 702/181; 702/81; 702/179; 702/185

(58) Field of Classification Search ............ 702/81–84, 702/117, 118, 179, 181–183, 185; 382/145, 382/149; 716/4 W
See application file for complete search history.

(56) References Cited

U.S. PATENT DOCUMENTS

| | | | | |
|---|---|---|---|---|
| 3,615,464 A | * | 10/1971 | Agusta et al. | 430/312 |
| 4,659,426 A | * | 4/1987 | Fuller et al. | 438/719 |
| 5,075,253 A | * | 12/1991 | Sliwa, Jr. | 438/109 |
| 5,544,256 A | * | 8/1996 | Brecher et al. | 382/149 |
| 5,822,218 A | * | 10/1998 | Moosa et al. | 716/4 |
| 5,886,909 A | | 3/1999 | Milor et al. | 716/4 |
| 5,982,683 A | * | 11/1999 | Watson et al. | 365/201 |
| 5,991,699 A | * | 11/1999 | Kulkarni et al. | 702/83 |
| 6,020,957 A | | 2/2000 | Rosengaus et al. | 356/237.4 |
| 6,035,244 A | | 3/2000 | Chen et al. | 700/110 |
| 6,066,179 A | * | 5/2000 | Allan | 716/4 |
| 6,198,529 B1 | * | 3/2001 | Clark et al. | 356/237.5 |
| 6,222,936 B1 | | 4/2001 | Phan et al. | 382/149 |
| 6,396,943 B2 | | 5/2002 | Yamashita | 382/144 |
| 6,449,749 B1 | * | 9/2002 | Stine | 716/4 |
| 6,456,951 B1 | * | 9/2002 | Maeda et al. | 702/81 |
| 6,496,958 B1 | * | 12/2002 | Ott et al. | 716/4 |
| 6,507,930 B1 | | 1/2003 | Bass, Jr. et al. | 716/2 |
| 6,507,933 B1 | | 1/2003 | Kirsch et al. | 716/4 |

(Continued)

FOREIGN PATENT DOCUMENTS

JP 2001194351 A * 7/2001

(Continued)

*Primary Examiner*—Jeffrey West
(74) *Attorney, Agent, or Firm*—Harrington & Smith, PC

(57) ABSTRACT

A system and method is disclosed for assessing a probability of failure of operation of a semiconductor wafer. The method includes inputting risk factor data into a memory and inputting a plurality of wafers into a semiconductor fabrication manufacturing process. A subset of wafers is selected to obtain a sample population and at least one region of each wafer of the sample population is inspected. Circuit design data associated with each wafer of the sample population is obtained and one or more defects that present an increased risk to the operation of a particular wafer are identified. The identification is a function of the risk factor data, the inspecting step and the circuit design data. A probability of semiconductor wafer failure is calculated.

22 Claims, 9 Drawing Sheets

U.S. PATENT DOCUMENTS

| | | | |
|---|---|---|---|
| 6,596,639 B1 * | 7/2003 | Easter et al. | 438/692 |
| 6,598,210 B2 * | 7/2003 | Miwa | 716/4 |
| 6,707,936 B1 * | 3/2004 | Winter et al. | 382/149 |
| 6,738,954 B1 * | 5/2004 | Allen et al. | 716/4 |
| 6,813,572 B2 * | 11/2004 | Satya et al. | 702/82 |
| 2002/0051567 A1 * | 5/2002 | Ganz et al. | 382/152 |
| 2002/0062465 A1 * | 5/2002 | Goto | 714/724 |
| 2003/0120459 A1 * | 6/2003 | Lee et al. | 702/181 |
| 2004/0210803 A1 * | 10/2004 | Cheng et al. | 714/710 |

FOREIGN PATENT DOCUMENTS

JP          2003107134 A  *  4/2003

* cited by examiner

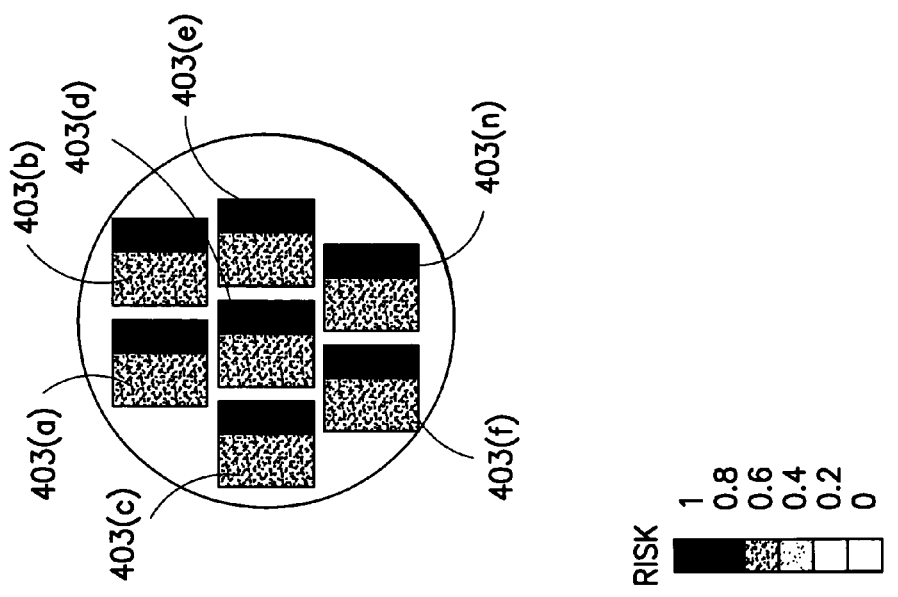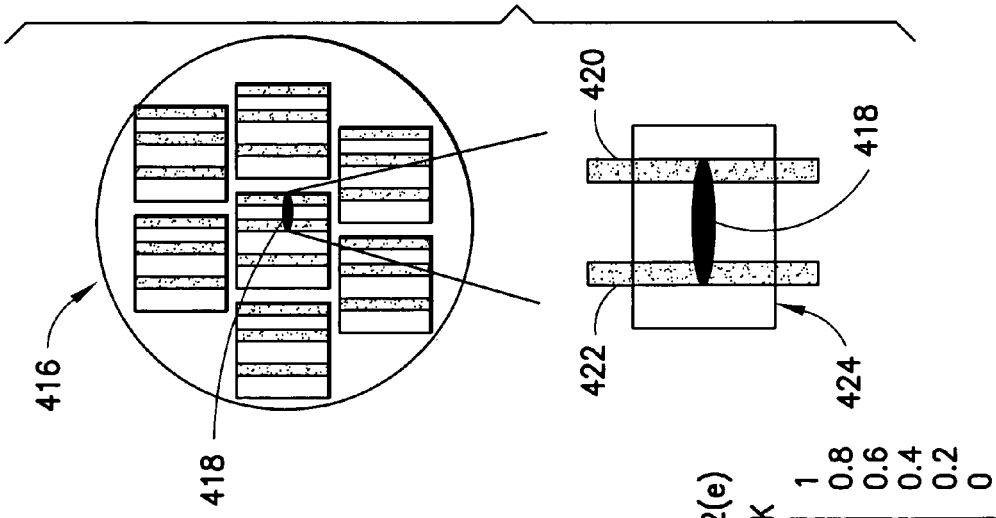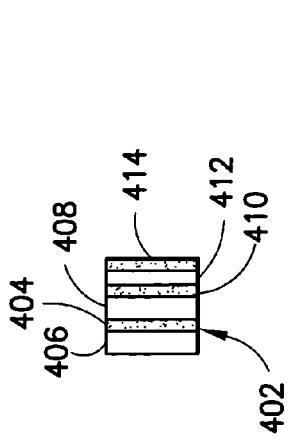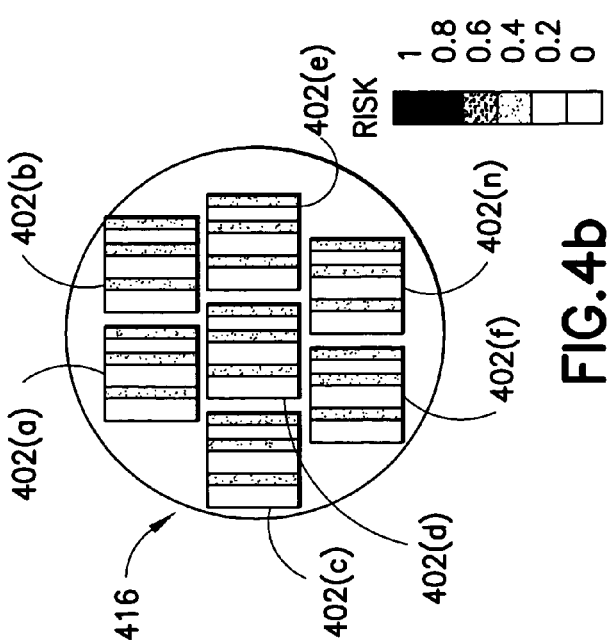

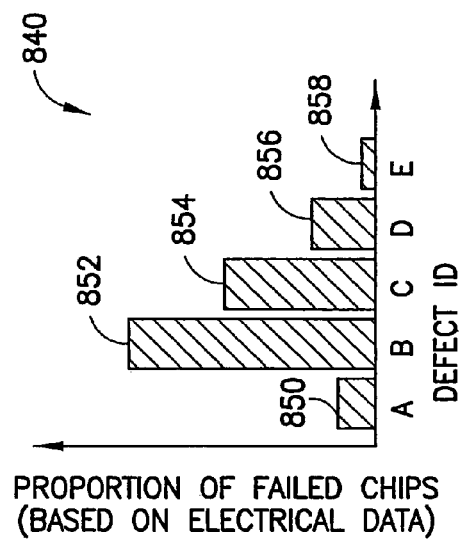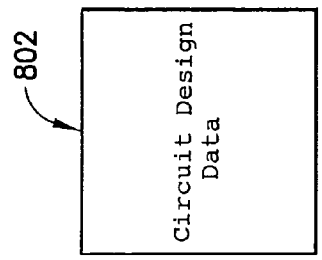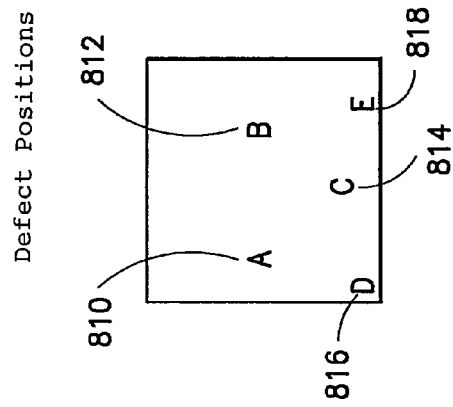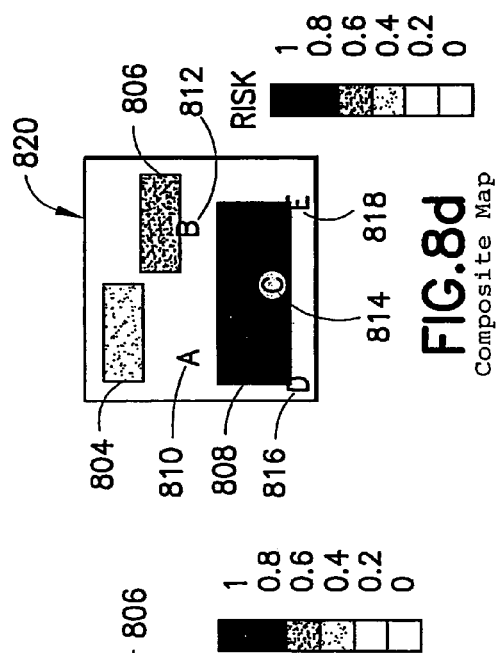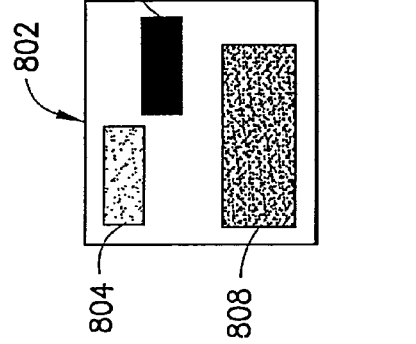

SYSTEM FOR IDENTIFICATION OF DEFECTS ON CIRCUITS OR OTHER ARRAYED PRODUCTS

FIELD OF THE INVENTION

This invention relates generally to a system and method for manufacturing products having an array of sub-components, such as wafers and semiconductor circuits. More particularly, the present invention relates to efficiently identifying and characterizing defects in such products, improving yield and identifying yield trends. The present invention is particularly valuable in the fabrication of wafers and semiconductor circuits.

BACKGROUND OF THE INVENTION

In the semiconductor industry, there is a continuing movement towards higher integration, density and production yield, all without sacrificing throughput or processing speed. The fabrication of integrated circuits (ICs) requires a complex process to ensure the proper balance between throughput, processing speed and yield. Inspections and tests are designed to detect unwanted variations in the wafers produced, as well as in the equipment and masks used in the fabrication processes. One small defect in either the devices produced or in the process itself can render a finished device inoperable.

Manufacturing ICs is a complex process that may involve hundreds of individual operations of fabrication, inspection and testing steps that are interwoven throughout the entire process. The fabrication process includes the diffusion of predetermined amounts of a dopant material into predetermined areas of a wafer, which is typically silicon, to produce active devices such as transistors. This is usually accomplished by forming a layer of silicon dioxide on the wafer, then utilizing a photomask and photoresist to define a pattern of areas into which diffusion occurs through a silicon dioxide mask. Openings are then etched through the silicon dioxide layer to define the pattern of precisely sized and located openings through which diffusion will take place. After a predetermined number of diffusion operations have been carried out to produce the desired number of transistors in the wafer, they are interconnected. Interconnection lines, or interconnects, are typically formed by deposition of an electrically conductive material that is formed into the desired interconnect pattern by a photomask, photoresist and/or etching process. Some high-performance ICs like the 1.3 GHz IBM Power4 microprocessor have hundreds of millions of transistors on a chip measuring 2 cm by 2 cm. Such chips include various devices disposed among 6 or 8 vertical layers and copper interconnects that total over a mile in length. Both devices and interconnects are measured in submicron dimensions.

In view of the device and interconnect densities required in current ICs, it is desirable that the manufacturing processes be carried out with utmost precision and in a manner that minimizes defects. In order to achieve reliable operation, the electrical characteristics of the circuits must be kept within carefully controlled limits, which require a high degree of control over all of the formation operations and fabrication processes. For example, in the photoresist and photomask operations, the presence of contaminants such as dust, minute scratches and other imperfections in the patterns on the photomasks can produce defective patterns on the semiconductor wafers, resulting in defective integrated circuits. Furthermore, defects can be introduced in the circuits during the diffusion operations themselves. Defective circuits may be identified by, for example, optical tools and electron-based tools. Various inspection tools offer different advantages (e.g., different resolution, different magnification, different wafer throughput). Typically, the smallest defects are inspected with SEM, or scanning electron microscopy. Optical diagnostic tools such as picosecond imaging circuit analysis, laser voltage probing, light-induced voltage alteration, optical beam induced current, Seebeck effect imaging, thermally-induced voltage alteration, and soft defect localization are becoming more common in IC chip fabrication. Once defective ICs have been identified, it is desirable to take steps to minimize the number of defective ICs produced in the manufacturing process, thus increasing the yield of non-defective ICs.

Defects are the primary killers of devices, wafers and circuits formed during manufacturing processes, resulting in yield losses. Increases in device density require smaller devices and interconnects, which appear to be approaching a physical limit of operability for certain such devices (i.e., field-effect transistors with channel layers several atomic layers thick). Defect detection in such atomic level devices becomes increasingly challenging. Specifically, it is more difficult to detect defects in individual devices or interconnects due to their smaller size, yet higher device density on a single chip means fewer total defects per chip are acceptable without causing chip failure. Many of the defects that cause poor yield in ICs were caused by particulate contaminants or other random sources. However, many of the defects seen in modem IC processes are not a result of particulates or random contaminants, but rather stem from systematic sources. Examples of systematic defect sources include printability problems from using aggressive lithography tools, poly stringers from improperly formed suicides, gate length variation from density driven and optical proximity effects. Other examples of defects include bubbles and particles in the photoresist layer of the IC. The diagnosis of defects in the photoresist layer can only be accomplished after the photoresist is developed. Furthermore, it is typically the case that the bubbles and particle defects in the photoresist do not appear as bubbles or particle defects after the photoresist is developed, but may take on some other distorted shape or appearance, further complicating the diagnosis.

In attempting to decrease the number of defective ICs produced in the manufacturing process, thereby increasing the yield, it is necessary to consider that any one or more of possibly several hundred processing steps may have caused a particular circuit to be defective. With such a large number of variables, it can be extremely difficult to determine the exact cause or causes of a defect or defects in a particular circuit thereby making it extraordinarily difficult to identify and correct yield reductions. While inspection of the completed ICs may provide some indication of which process operation may have caused the circuits to be defective, inspection equipment often does not capture many of the sources of systematic defects and/or the tools can be difficult to use effectively and reliably. Furthermore, inspection equipment may detect false defects, false alarms or nuisance defects that frustrate attempts to reliably detect true defects or sources of defects.

Once a particular cause of a true or catastrophic "killer" defect has been identified after completion of the fabrication process, it can be confirmed that a problem in a particular process operation was present at the time that the particular process operation was carried out, which could have been weeks or even months earlier. Thus, the problem might be corrected only after many defective ICs have been produced. By the time the first problem has been identified, other process operations may be causing problems. Thus, after-the-fact analysis of defective ICs and identification of process operations causing these defective products are of limited value to improve the overall yield of ICs.

What is needed to advance the state of the art is a method and apparatus of adaptive filtering of wafers and chips with chip design data within a semi-conductor fabrication process for accurate identification of catastrophic defects and accurate yield trends.

SUMMARY OF THE INVENTION

Accordingly, one embodiment of the present invention is directed to a method for assessing a probability of failure of operation of a semiconductor wafer. This method includes inputting risk factor data, which includes circuit location and defect type, into a memory and inputting a plurality of wafers into a semiconductor fabrication manufacturing process. Each wafer has at least one mask layer. A subset of wafers is selected to obtain a sample population and at least one region of each wafer of the sample population is inspected. Circuit design data associated with each wafer of the sample population is obtained. One or more defects that present an increased risk to the operation of a particular wafer are identified, if present on the wafer. The identification is a function of the inspecting step and the circuit design data. A probability of semiconductor wafer failure is thereby established by comparing the identified defect(s) to the risk factor data.

Another embodiment of the present invention is directed to a process for calculating a risk factor for a region of a wafer. This process includes obtaining circuit design data and correlating the circuit design data with a surface of the wafer. Location defects on the wafer are identified using design shapes that are in the region of the defect. The location risk is evaluated and a failure probability in the region is determined.

Yet another embodiment of the present invention is directed to a method of generating a data representation. This method includes providing circuit design data and identifying one or more enhanced risk regions of the circuit design data. Defects are identified and data indicative of overlap between the enhanced risk regions and the one or more defects is generated. The quantity of defective circuits is also established.

Yet another embodiment of the present invention is directed to an apparatus for assessing one or more flaws in a circuit. This is accomplished by a calculation module that selects a function to calculate a location of risk of the circuit. A location module establishes a defect location as a function of circuit design data and an evaluation module that receives data from the calculation module and the location module, and generates an output as a function of the received data; where the output identifies an inspection area of the circuit.

Yet another embodiment of the present invention is directed to a method for assessing regions of interest of a circuit, the method being stored as computer executable instructions on a computer-readable medium. The method includes the steps of providing circuit design data and providing defect data relating to one or more defects. A region of the circuit that contains a location of the defects is identified and a failure probability is generated as a function of the circuit design data, defect data and positional location.

The present invention is not limited only to integrated circuits, but also applies to any product that has an array of sub-components. The term "array" as used herein refers to an assemblage having a highly ordered arrangement, especially an assemblage of small-scale objects. Examples of products with arrayed sub-components include an array of optical devices or nano-scale mechanical devices, a flat panel display having arrayed layers and/or electro-optical components, and a micro-capillary array such as may be used in genetic sequencing. In its broader sense, then, another embodiment of the present invention is a method for evaluating defects in a product that defines an array of components. This broader method includes inputting risk factor data into a memory such as a computer readable memory, and inspecting at least one region of the product in accordance with the risk factor. The region may be defined as a particular sub-component, a type or class of sub-components, any location wherein a particular arrangement of materials is more prone to failure (such as any interface between a superconductive material and a buffer layer to which it is bound), or a particular physical location within the product. The method further includes obtaining design data associated with the product, and identifying one or more defects that present an increased risk of failure of the product based on the risk factor data, the design data, and the inspecting of the at least one region of the product. Preferably, identified defects are used to update various weighting factors that may be associated with one or more risk factors.

Yet another embodiment of the present invention is a method of enabling efficient detection of defects in a product defining an array of sub-components. This particular method includes using product design information and at least one risk factor related to manufacture of the product to populate a database, and allowing a third party access over a network to relevant information in the database. The relevant information includes at least design data tailored the detection of defects within sub-components and/or physical locations of the product, and at least one weighted risk factor that may be used to identify a specific sub-component and/or a specific physical location of the product that are prone to defects. Preferably, at least one weighted risk factor in the database is updated based on an input from the third party, the input most preferably related to actual defect detection.

Another aspect of the present invention that does not necessarily include a network includes a computer program embedded on a medium readable by a computer, such as a CD-ROM, a zip-drive, or a hard-drive to which the computer program may be downloaded via network or from an interim medium. The computer program includes several code segments that may be intertwined when composed or decompiled, but that are functionally separated into the following. A first program code segment includes design data for a product that defines an array of sub-components. A second program code segment includes risk factor data relating to likelihood of a defect in at least one of a sub-component or a physical location of the product. A third program code segment provides for inputting data related to actual defects discovered in the product. Preferably, this aspect of the invention also includes a fourth program segment that modifies the risk factor data in response to data input that relates to actual defects discovered.

BRIEF DESCRIPTION OF THE FIGURES

The foregoing and other objects, aspects, and advantages will be better understood from the following non limiting detailed description of preferred embodiments of the invention with reference to the drawings that include the following:

FIGS. 4a, 4b, 4c and 4d show risk factor generation including circuit design data.

FIGS. 8a-8e show several examples of data display. FIG. 8a shows design data; FIG. 8b shows design data with high risk regions and low risk regions identified; FIG. 8c shows defect identification and positional locations; FIG. 8d shows an overlay of defect data and risk data; and FIG. 8e shows a histogram that represents the proportion of dead circuits, obtained from electrical test data, that contains certain identified defects.

DETAILED DESCRIPTION OF THE INVENTION

Figure 1:
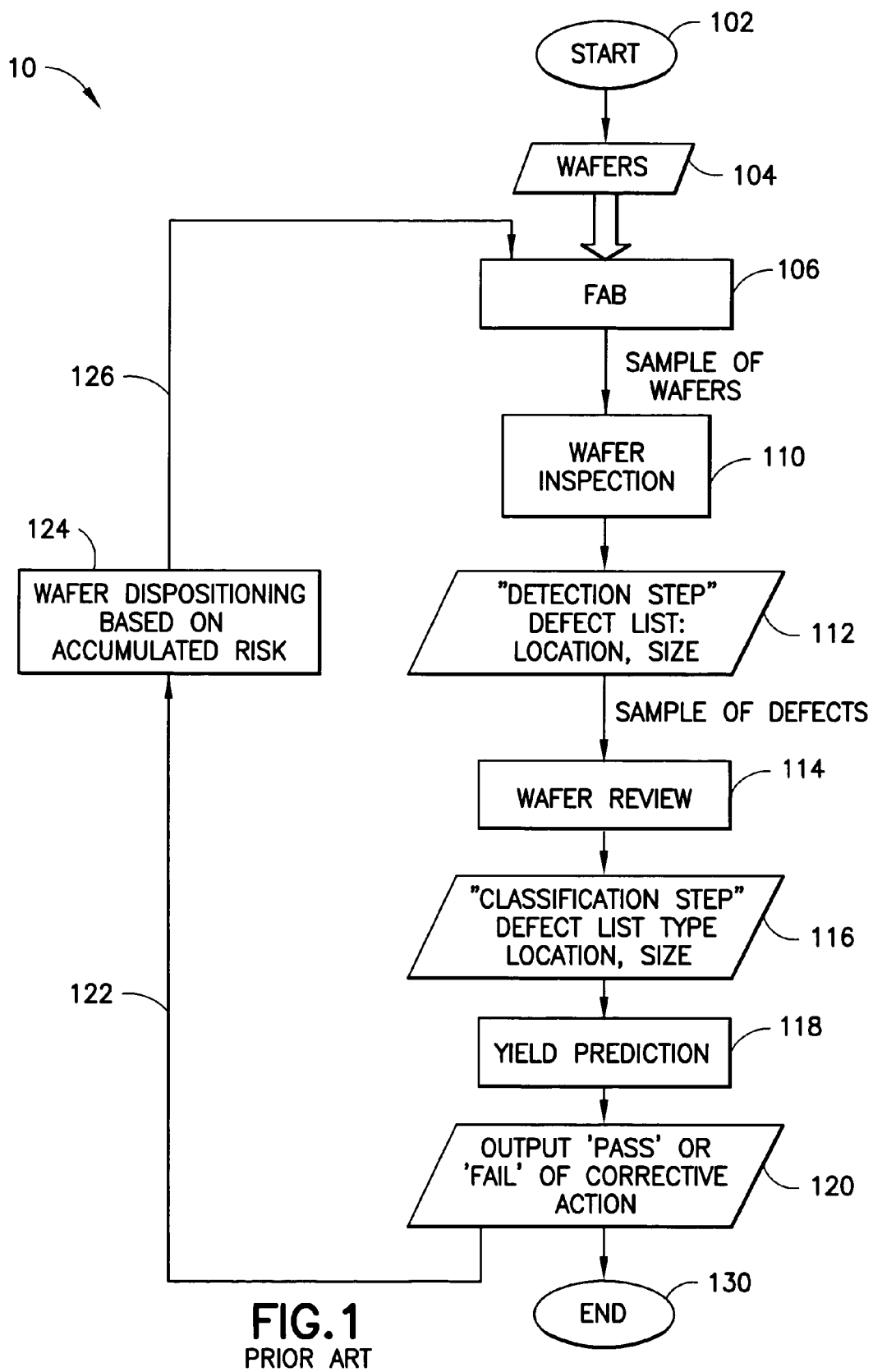
FIG. 1 is a flow diagram of a circuit/wafer manufacturing process.

Semiconductor fabrication yield teams are continually challenged to increase yields. The lost revenue for each point of yield loss can be significant. In addition, the inspection process can be expensive and slow. Each tool has an associated Cost of Ownership (COO) which is driven by the capital cost of the tool and the tool's throughput. In order to increase yields there is a need to make better use of inspection resources. This can be accomplished by limiting the area inspected by high COO inspection tools, and by limiting the defects requiring review in high COO review tools.

The present invention is an improved system and method for identifying catastrophic or killer defects in semiconductor wafers and/or circuits, and identifying at risk semiconductor wafers and/or circuits, i.e., those wafers and/or circuits that exhibit an enhanced risk of catastrophic failure or inoperability. The present invention also applies to multi-layer semiconductor wafer and/or circuit manufacturing and semiconductor wafer and/or circuit design. Thus, the present invention improves yield, yield prediction, failure analysis, inspections, and defect understanding.

The present invention provides a method and apparatus to use circuit design data within a semiconductor fabrication process to identify catastrophic or killer defects and to accurately predict yield trends. The method and apparatus also identifies individual at-risk circuits on wafers. The circuit design data can include the shape of metal layers, via layers, and device layers. After a defect is detected in a particular region on the wafer, the circuit design data in that region can be used to assess the risk that the defect is a circuit-killer defect. This risk factor is associated with circuit location and defect type. Two possible considerations to assess risk in a region around a defect are the metal fraction and critical area.

Circuit design data may also be used to more accurately identify catastrophic, killer-type defects and to more accurately predict yields by creating a risk map. The risk map may be used to define inspection areas on circuits, define the probability of failure for each defect, calculate a predicted yield, and to define the defect review sample.

Wafer and/or circuit defects are typically any flaw, imperfection, defect, impurity, occlusion or deformity on the circuit/wafer that may or may not cause the circuit to fail. Such defects may be within a particular device or group of devices, within an interconnect, or at an interface between vertical layers of the wafer. Catastrophic, or killer, defects are any flaw, imperfection, defect, impurity, occlusion or deformity that causes the circuit to fail, i.e., that kills the circuit.

Location risk is a quantity related to location that describes the contribution of the design data to the probability of failure, such as local critical area, local metal fraction, and/or other similar or related factors. The probability of failure of a defect is the probability that the defect will result in catastrophic damage i.e., kill the circuit, or cause the circuit to malfunction in a manner that defeats the operation of the wafer/circuit.

The present invention makes better use of options of sending wafers with defects with enhanced risk(s) and/or multiple defects for additional or further review. Such review can include further inspection and/or SEM (scanning electron microscope) review. One method is that a sample of wafers may be inspected automatically by the tools and then sent to SEM review, where a sample of the defects on each wafer is classified by an engineer using a scanning electron microscope. The latter is the throughput-limiting step, since the defect type is not known when a defect is sent to SEM review. Thus, there is no way for the engineer to know the risk factor at this point. The engineer is typically forced to rely on an established statistical yield model in order to compute the probability that this defect is a circuit-killer, given its size only. However, the present invention has the advantage that the estimated probability of circuit-kill is used to create a sample of defects to be sent to SEM review: defects for which this probability is large are more likely to be included in the sample. Engineers will also have the option of reviewing only the wafers at greatest risk.

The present invention also permits the option of preferentially inspecting the high-risk areas of the circuit. For example, if the location risk varies greatly by region of the circuit, it might be advantageous to concentrate the automatic inspection itself on the regions of the circuit with enhanced risk, only occasionally inspecting the lower-risk regions. This maximizes resources and provides the most efficient results. Defects from a previous manufacturing step can be subtracted from the observation list.

The present invention makes effective use of voltage-contrast inspection tools. Advanced inspection tools that use voltage-contrast to identify defects are available and may have additional applications as design dimensions continue to shrink. However, their use is much more time-consuming than current tools, and cannot at present be used to inspect entire wafers. To use these tools effectively, it is helpful to identify the highest-risk areas of the circuit and then focus the inspection process on the identified high-risk areas.

The present invention has the advantage of a multiple stage implementation. The first stage involves calculation of a probability of circuit failure based on defect size, defect classification, defect location, and risk factor. The second stage involves refining the probability of circuit failure based on historical data. This historical data is typically gathered over an extended period of time, for example, data gathered over months of failure analysis and sort data. The third stage involves applying the refined probability of circuit failure to new products without being required to repeat the learning process. This provides substantial cost savings for circuit analysis and defect identification, mitigation and elimination.

FIG. 1 is a flow diagram 10 of a circuit/wafer manufacturing process. Start block 102 begins the process. In the process, blocks 104 and 106 show that wafers are fed into the fabricator to initiate the manufacturing process. Block 110 shows that during the manufacturing process a sample of wafers is collected and inspected. Block 112 shows that the wafers have been inspected for defects or flaws (detection of defects) and a list of defects is produced. The list also provides the defect information, such as defect positional location and defect size. Block 114 shows that a sample of defects is selected for the wafer review step. The wafer review typically involves a process, which may be stored as a series of commands, on a computer-readable medium, such as RAM (random access memory), ROM (read only memory), PROM (programmable read only memory), CDROM, server location, workstation memory, floppy disk. The process analyzes the sampled defects. Block 116 shows a step of defect classification. This classification step produces a list of defects that indicates the defect type in addition to defect positional location and defect size. This defect information is then input into yield prediction module. The term module may include a facility, software, hardware, firmware, or any combination thereof, or ASIC (application specific integrated circuits), standard integrated circuits, or computer-implemented process. Yield prediction module is shown as block 118 that outputs to block 120 whether the wafer 'passes' or 'fails', or whether 'corrective action is needed'. Line 122 leads to block 124 in which an accumulated risk of the wafer/circuit is then obtained for each step, and each wafer is sorted appropriately. Line 126 leads to fabrication block 106 and wafers continue in the manufacturing process as indicated in FIG. 1 until end block 130 is reached.

Figure 2:
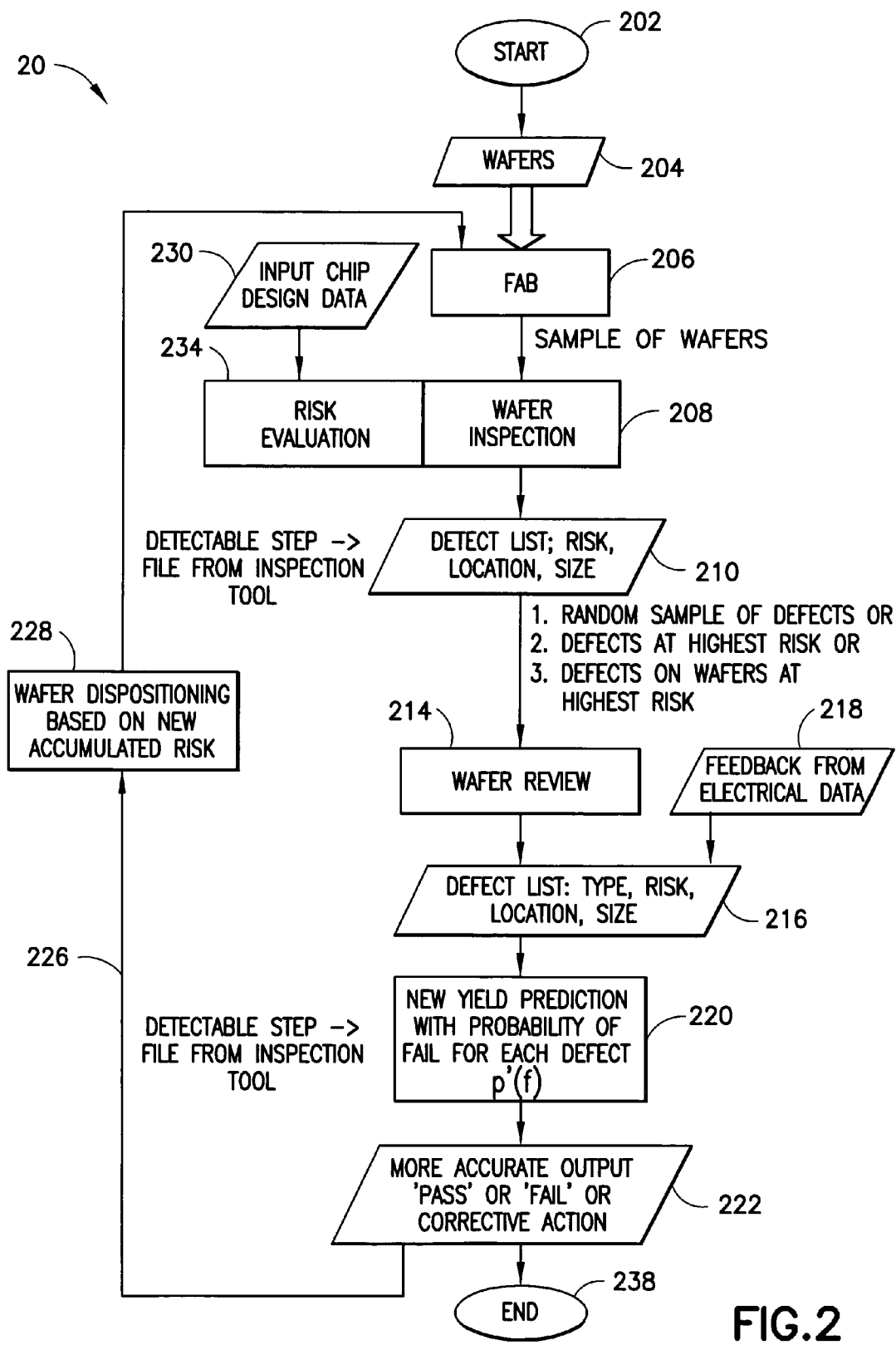
FIG. 2 is a flow diagram of circuit/wafer manufacturing process according to one embodiment of the present invention.

FIG. 2 is a flow chart 20 of a circuit/wafer manufacturing process according to the present invention. This process is typically controlled by an algorithm or commands, and the algorithm may be stored as module or facility, which may be, for example, hardwired into a device or programmed as software and stored on a computer-readable medium, such as RAM, ROM, PROM, CDROM, server location, floppy disk or any other storage medium that can be retrieved from memory or processed by a computer. Start block 202 begins the process. Block 204 shows that wafers are fed into a fabricator 206 to start the manufacturing process. Step 208 shows that a sample of wafers are inspected for detection of flaws (detection of defects). The inspection can be performed by a human operator, such as a human operator using an electron microscope or other instrumentation. However, it is preferred for the present invention to use inspection tools, as described below.

Inspection tools are typically used to detect defects or flaws. These inspection tools are, for example, scanners coupled to an electronic storage medium, or other memory or database and may also include a computer or processor. The scanner obtains data from the wafers. Typically, each inspection tool has its own file format for data that is converted to a common file format by a converter. The converted data is typically sent to a database loader. The scanned data that is input to the database loader may include scan data collected by the scanner such as location of the defects, size of the defects and other characteristics determinable by the scanner such as reflectance. The database loader loads the scan data for each defect into a relational database where a database file is built for each defect.

Figure 6:
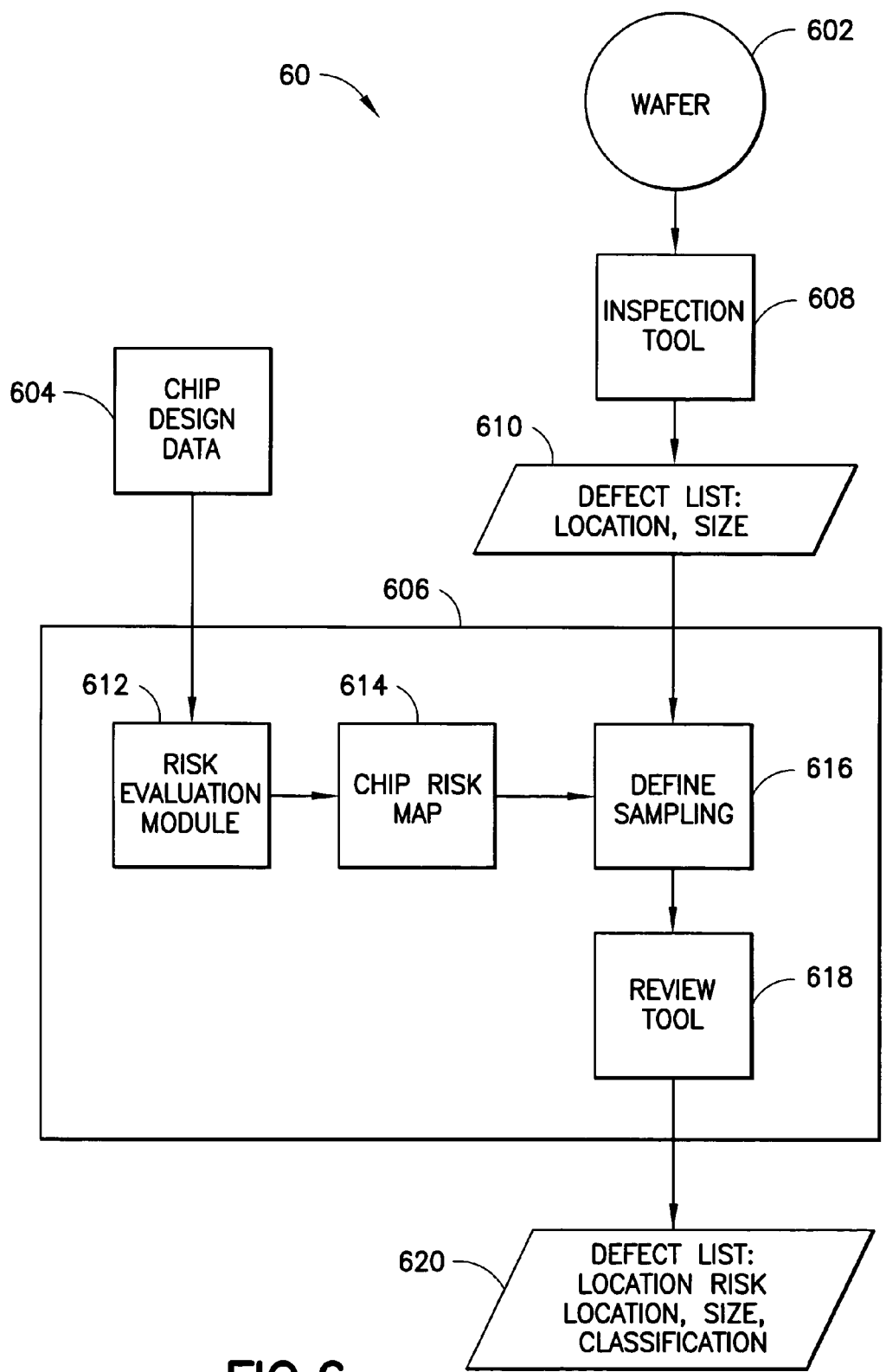
FIG. 6 is a system block diagram of an analysis tool according to a third embodiment of the present invention.
Figure 7:
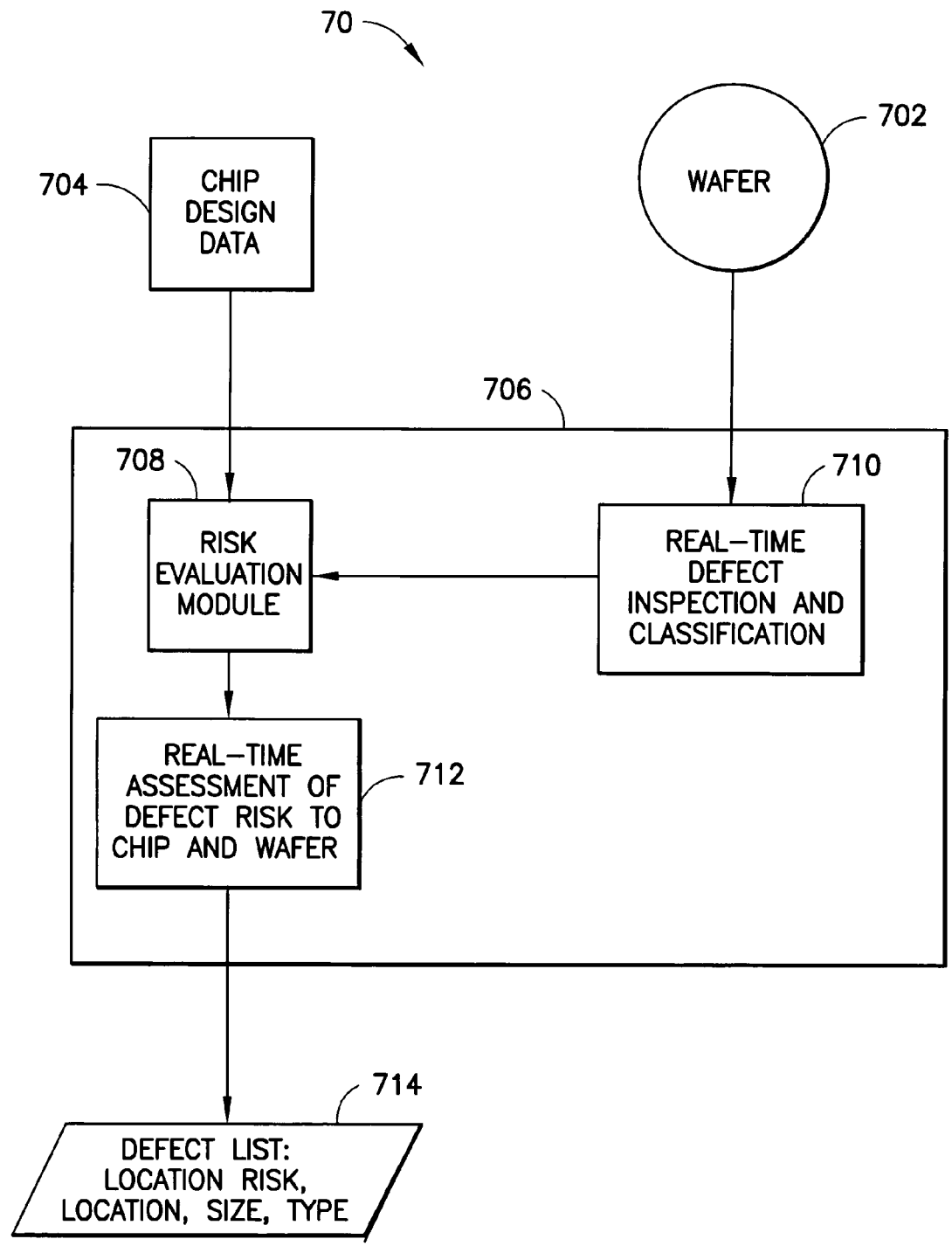
FIG. 7 is a system block diagram of an analysis tool according to a fourth embodiment of the present invention.

Block 230 shows that circuit design data associated with each mask level in the manufacturing process for each circuit/wafer is evaluated for risk, step 234. A mask level is the photolithography pattern defining the circuit features of a particular wafer or a selected plurality of wafers. The risk evaluation step 234 may be accomplished using a risk evaluation module, which may be a module that accumulates circuit design data. The module may be, for example, software, hardware, firmware, or any combination thereof, or ASICs, or standard integrated circuits, or any facility that has processing and storage capabilities sufficient to store and process the input chip design data. In the process shown in FIG. 2, the risk evaluation step 234 of the present invention is coupled together with the wafer inspection step 208 (other possibilities and configurations are shown in FIG. 6 and FIG. 7).

The risk evaluation step generates a circuit risk map. The map may be generated by a map generator facility, which is typically a software module or hardwired set of logic commands, or firmware or ASIC. The circuit risk map may be used to define the tool inspection area on the wafer and/or input into a function that generates the probability of failure of each flaw/defect that has been identified in the inspection step 208. This produces a list of defects that indicates defect location risk as well as defect positional location and defect size for the inspected regions of the circuit/wafer.

Block 210 shows that there are several options for selecting defects for the wafer review step. These include a sample identifier that can (1) generate a random sample of defects, and/or (2) select defects at highest risk, and/or (3) select defects on wafers at highest risk. Other options based on risk assessment are also possible. These include, for example, selecting an area of the circuit/wafer based on chip design data, or based on previous inspection steps.

Block 214 is a wafer review step, which reviews the wafer based on the defect list of block 210. Block 218 shows that feedback from electrical data is generated. This is a function of historical data and information gathered from the inspection step.

In block 216, the output from wafer review step 214 and feedback from electrical data, from block 218 are combined. During this step, the list of defects is revised to include defect information, such as defect location risk, as well as other defect information such as, for example, defect type, defect positional location, and defect size. This new defect information is then used to generate a new yield prediction, shown as block 220. This new yield prediction step may be performed by a yield prediction module or facility, which may be, for example, software that can take into account these risk assessments (with a new probability of fail function for each defect, based on risk). The yield prediction step outputs a more accurate assessment of whether the wafer 'passes' or 'fails' or whether 'corrective action is needed', as shown in block 222. Block 222 utilizes the accumulated risk of the wafer/circuit obtained at each step. Line 226 leads to block 228 in which each wafer is sorted or dispositioned appropriately. The manufacturing process continues until end block 238 is reached.

Figure 3:
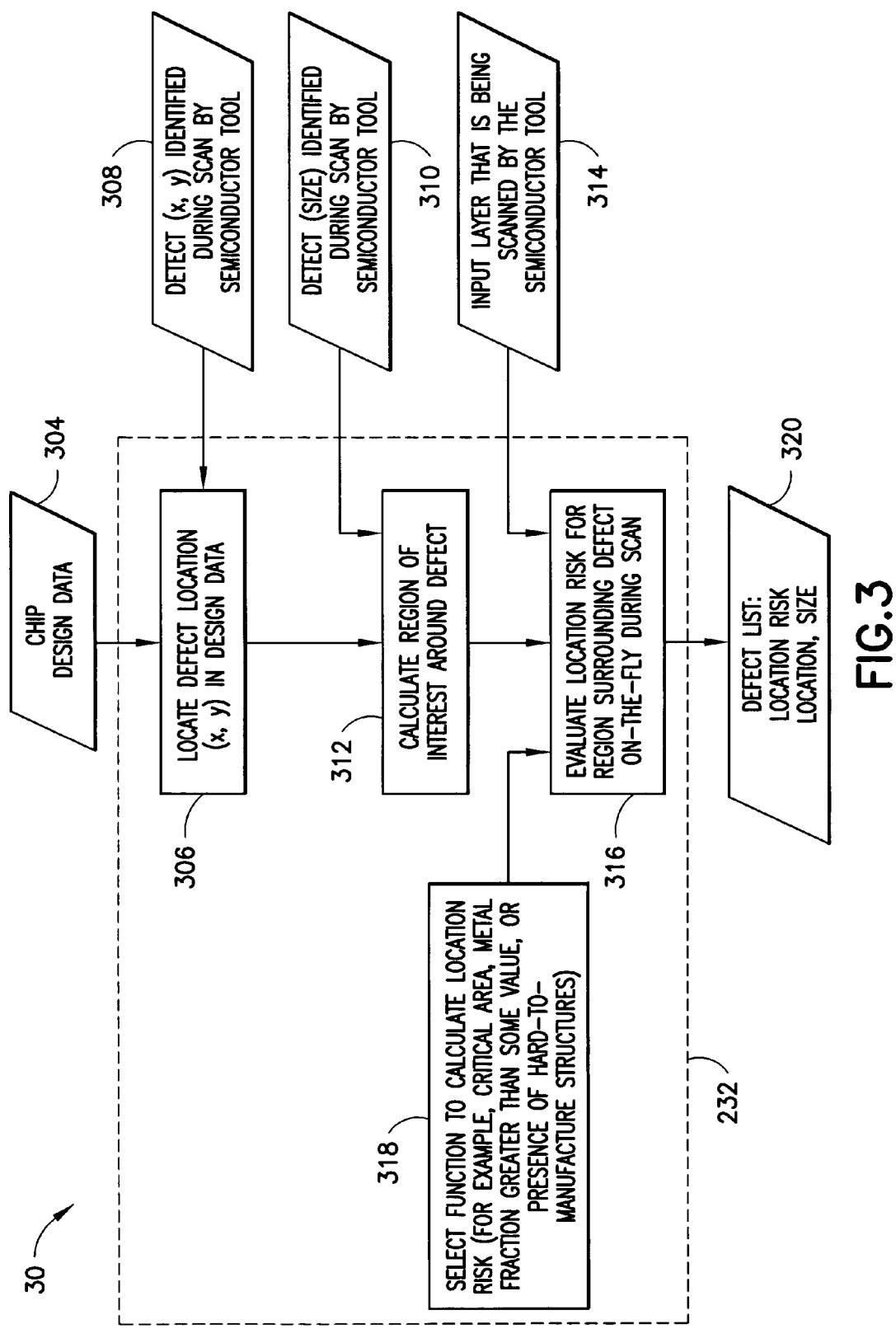
FIG. 3 shows a block diagram of a risk evaluation module according to the present invention.

FIG. 3 shows a more detailed view 30 of the Risk Evaluation Module 232. Information is input into the Risk Evaluation Module 232. This information includes, for example, (1) circuit design data, shown as element 304; (2) positional location data for each flaw/defect identified by an inspection tool, shown as 308; (3) defect size for each defect identified by an inspection tool, shown as 310; (4) data regarding the layer that is being processed at this particular step in the semiconductor/manufacturing process, shown as 314.

There are a plurality of modes of operation of the module. In one mode, the risk evaluation module 232 generates a risk map from the circuit data at all locations on the circuit (not just at defect position locations).

In another mode, the risk evaluation module 232 identifies the design data at the location corresponding to each defect. The risk evaluation module 232 then calculates a region of interest around the location, taking into account the location as a starting point, as well as the spatial resolution of the analysis tool. The risk evaluation module 232 includes a plurality of functional modules or facilities, which may be software, hardware, firmware, and any combination thereof, ASIC or standard integrated circuits. These functional modules are shown as blocks 306, 312, 316 and 318. Module 318 selects a function to calculate location risk, where the function takes into account defect size and all defect types on this layer. For example, possible options are local critical area and/or the local metal fraction (i.e., the amount of metal present compared to other types of material(s)) being greater than some predetermined threshold value. The risk evaluation module 232 performs the function of evaluating a location risk function for the region of interest, shown in block 316. The output of the risk evaluation module is a defect list that lists each defect and its associated risk, location and size, shown as block 320.

Referring now to the functional modules 306, 312, 316 and 318, it is to be noted that the function ascribed to each module may be performed by the risk evaluation module 232 or the modules shown in FIG. 3. Specifically the functions of the modules are discussed in more detail below.

Block 306 shows that a defect location in the design data is located. This location uses as a factor the defect identified during the scanning step by the semiconductor tool, block 308. Block 312 shows that a region of interest is calculated around the defect. This calculation utilizes the defect (size) identified during the scan, as shown by block 310 as well as the defect location identified in block 306. Block 316 shows evaluation of location risk for the region surrounding the defect during a scan. This includes input from the calculation of the region of interest, block 312, input from the layer being scanned, block 314, and input from the function to calculate location risk, block 318. The result of the evaluation is a defect list, as shown by block 320. This list includes location risk and defect location and defect size.

FIGS. 4(*a*)-4(*d*) show an illustration of how the shapes in the circuit design data in the region surrounding a defect can be used to associate a risk factor with the defect. One advantage to the present invention is that, rather than viewing the circuit design data as a black box, and ignoring the information contained in the design shapes on each mask level during circuit/wafer analysis (such as inspection, review, yield prediction, etc.), once a flaw and/or a defect is identified on the wafer, it is possible to identify the defect location and which circuit(s) it lands on, and design shapes in the region of the defect are taken into account in the analysis and/or yield assessment. This enhances the ability to identify potentially catastrophic defects in a circuit.

FIGS. 4(*a*)-4(*d*) show examples of location risk factor generation. FIG. 4(*a*) shows an example of circuit design data 402. The circuit design data includes various portions 404, 406, 408, 410, 412, 414. Each of those portions, or regions, reflects information related to the circuit configuration.

FIG. 4(*b*) shows a wafer 416 that is tiled with a plurality of circuit design data elements 402(*a*) . . . (n), where n is any suitable number. Each circuit design data elements 402 include information about the circuit configuration. This circuit configuration is shown in FIG. 4(*a*).

FIG. 4(*c*) shows an example of a defect 418 on a tiled wafer 416 with a close up view of the design data in the region 424. The region 424 is an area surrounding the defect 418 that is of particular interest because it may provide evidence of the cause of the defect 418. Thus, once a defect has been identified, the present invention captures information in a region 424 surrounding the defect to further identify other possible defects or design flaws that contributed to the defect so that additional defects can be identified and/or mitigated. The dimensions of the region 424 are a design consideration and depend on the type of defect being identified, the size of the defect, the location of the defect, the circuit design data and the scanning operation. FIG. 4(*c*) illustrates that the region of interest 424 includes portions of the metal pattern 420, 422 from the chip data. Thus, the metal pattern is included in the region 424 and data related to the metal pattern may be utilized in analysis of the particular defect 418 as well as identification, analysis and/or mitigation of other existing defects or possible subsequent defects.

The lower part of FIG. 4(*c*) illustrates the use of the design shapes by the present invention, namely the identification of a region of interest around each defect and the design shapes that pass through this region. This information is input into the risk evaluation module, described above, which evaluates the location risk to produce a probability of fail in the region of the defect; this probability of fail can be based on a number of functions as described above in association with FIG. 3, and is illustrated as the shading region in FIG. 4(*d*), where the degree of shading is a schematic representation of the degree of location risk calculated by the risk evaluation module (see the Key in FIG. 4(*d*)).

Thus, FIG. 4(*d*) shows a depiction of the risk factor for FIG. 4(*c*). For this example, the risk factor is calculated as the metal fraction in the region around the defect. A risk map 403(*a*) . . . (n) is generated for each design data element 402(*a*) . . . (n), shown in FIG. 4(*b*). The risk map 403 identifies a risk factor, or ratio, for each portion of the design data. For example, portion 406, from FIG. 4(*a*), may have a zero risk factor while portion 410, from FIG. 4(*a*), may have a 0.8 risk factor.

Data obtained from the steps shown in FIGS. 4(*a*)-4(*d*) enables merging of inspection data with design data to improve yield learning, as well as folding, or combining, design data with inspection data to rank defects based on probability of the defect causing circuit failure and generating feedback from electrical data to improve ranking of defects. Thus, the data shown in FIGS. 4(*a*)-4(*d*) provides an improved inspection technique by identifying a region of interest and utilizing data from that region.

Figure 5:
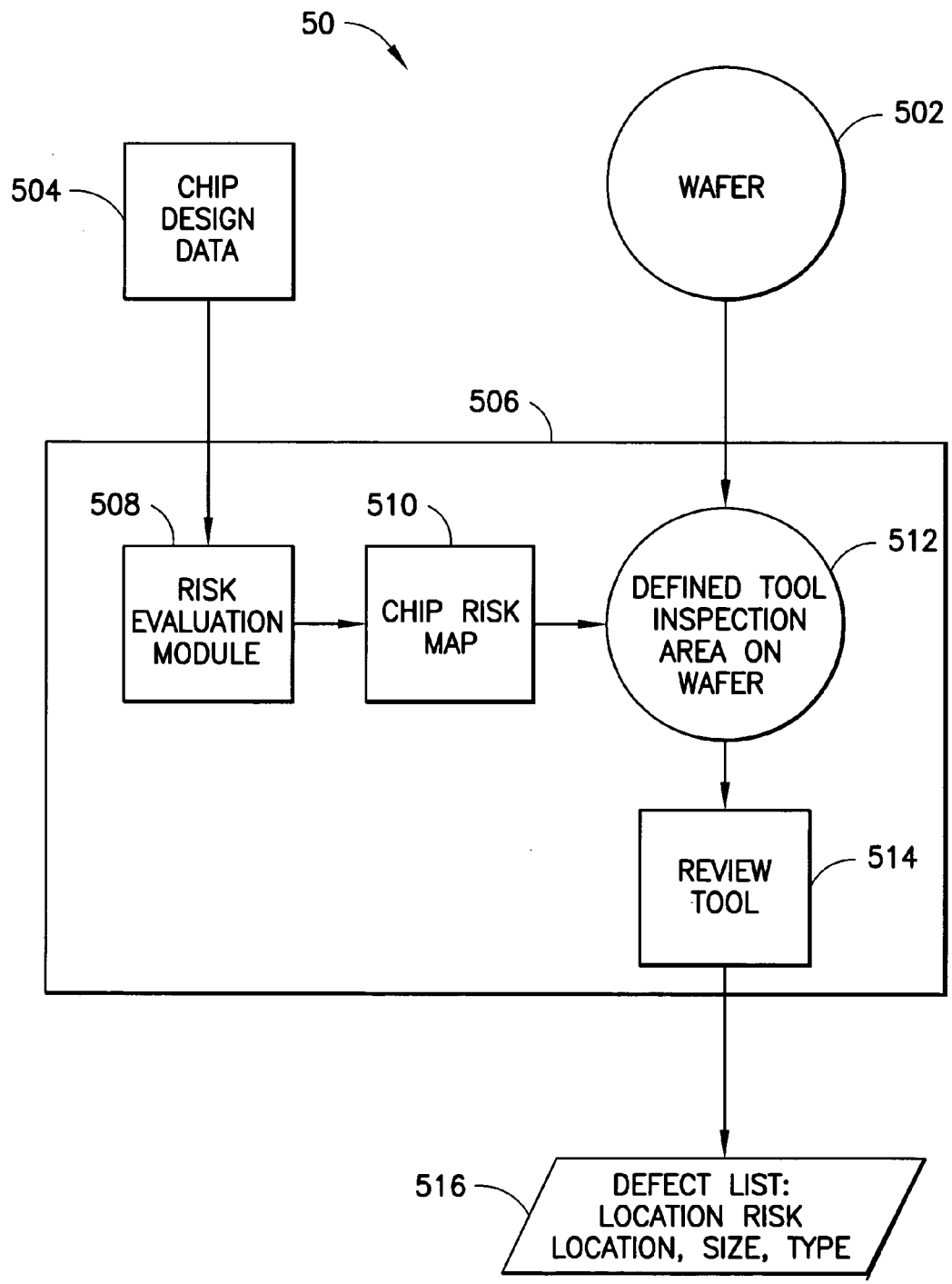
FIG. 5 is a system block diagram of an analysis tool according to a second embodiment of the present invention.

FIG. 5 is a block diagram 50 of one embodiment of the present invention. Inputs to inspection tool module 506 include wafers 502 and circuit, or chip, design data 504. The chip design data 504 is input to risk evaluation module 508 and wafer 502 is input to defined tool inspection area on wafer 512. Information related to circuit design data is merged with analysis tools. FIG. 5 shows one way that circuit design data is merged with the inspection tool. In this embodiment, a risk map is generated from information in the design shapes, and this risk map defines the tool inspection area. Information obtained from the design shapes resides in the inspection tool during inspection. The risk evaluation module 508 generates a profile of the degree of risk, or probability of component or portion failure, which is provided, as input, to a chip risk map module 510. Chip risk map module 510 generates data indicating increased risk areas or portions of the wafer/circuit that may experience enhanced probability of failure. This risk map is provided to defined tool inspection module 512. The defined tool inspection module 512 generates a profile based upon inspection of the wafer/circuit. The output from the defined tool inspection module 512 is provided to review tool module 514. The review tool module 514 reviews the wafer/circuit based on the inspection module 512 and the output of the review tool module 514 is a defect list 516. The defect list 516 includes, among other data: defect risk, positional location, defect size, and defect type.

FIG. 6 is a block diagram 60 of another embodiment of the present invention. Analysis tool module 606 includes risk evaluation module 612, chip risk map module 614, sampling generator module 616 and review tool 618. Chip design data 604 is input to risk evaluation module 612. Wafer 602 is input to inspection tool module 608. Inspection tool module 608 is typically, for example, one or more scanners, or other data-obtaining devices that are capable of obtaining data from a wafer/circuit. The inspection tool module 608 generates a defect list 610. The defect list 610 includes, for example, defect location, defect size and defect type. The defect list 610 is input to a sampling module 616, which is, for example, software, hardware, firmware, or any combination thereof, or ASIC, or standard integrated circuit.

The sampling generator 616 takes as inputs the output of circuit risk map module 614 and a list of defects 610 with defect information (that is, their positional locations and sizes as identified by the inspection tool module 608) in order to produce a list of defects that will be sampled. The present invention has the advantage that rather than random sampling for defects, which may miss risky defects and instead sample harmless defects, the present invention targets specific, high probability defects. The sampled defects are then sent to the review tool module 618, and the output of the system is a defect list 620 with additional defect information: location risk, positional location, defect size, and defect type. This is a result of the inputs, specifically a circuit risk map which is used to define sampling of the defects on the list provided.

FIG. 7 is a block diagram 70 of yet another embodiment of the present invention. This embodiment includes analysis module 706, which includes functional modules or functionality facilities 708, 710, 712. Inputs to the module 706 are wafers 702 and associated circuit design data 704. The chip design data is input to risk evaluation module 708. The wafers are input to real-time defect inspection and classification module, or tool, 710. The inspection tool 710 performs real-time inspection and classification of the flaws/defects on the wafers, and this information is fed in real-time to the risk evaluation module 708. Module 712 receives the output from risk evaluation module 708 and module 712 generates a real-time assessment of defect risk to the circuit and wafer. The output of module 712 is provided to module 714, which generates a defect list with the following defect information: location risk, location, defect size, and defect type.

FIG. 7 shows a technique for merging information in circuit design data with analysis tools, in this case, the design shapes are accessed on-the-fly when a defect is identified during analysis, and defect risk is assessed based on the design shapes in the location of the particular defect. In this embodiment there is interaction during inspection with the database containing the design shapes. In particular, the circuit design data and information from real-time defect detection and classification is fed to the risk evaluation module 708, which then produces a real-time assessment of defect risk to circuit and wafer.

FIGS. 8(a)-8(e) show several examples of data display. FIG. 8(a) shows circuit design data 802. FIG. 8(b) shows circuit design data 802 with high and low risk regions identified. FIG. 8(b) is a schematic illustration of the regions used for sampling as described in FIG. 6. Specifically, as shown by FIG. 8(b), region 806 is a higher risk region than regions 804 and 808. The region risk identification is a relative scale.

FIG. 8(c) shows defect identification and positional locations. Specifically, 810, 812, 814, 816 and 818 each identify a particular defect and a positional location associated with the defect.

FIG. 8(d) shows an overlay of the defect identification and location (FIG. 8c) with the design data risk regions (FIG. 8b). As shown by FIG. 8(d), regions 804, 806 and 808 are superimposed with defect locations 810, 812, 814, 816 and 818 to provide a composite map 820. This map 820 provides increased information regarding defects since it includes region data with defect data combined with one another. This enables more accurate analysis and calculation of failure rates and failure probabilities.

FIG. 8(e) shows a histogram 840 illustrating the number of dead circuits (as obtained from electrical test information) that contain certain identified defects. This data is shown by bar graphs 850, 852, 854, 856 and 858. FIG. 8(e) is a simplistic representation of how electrical test data will be used; the defects with more associated circuit fails will have a higher probability of fail. As shown in FIG. 8(e), defect B, graph 852 has a higher probability of fail than defect E, graph 858.

Figure 9:
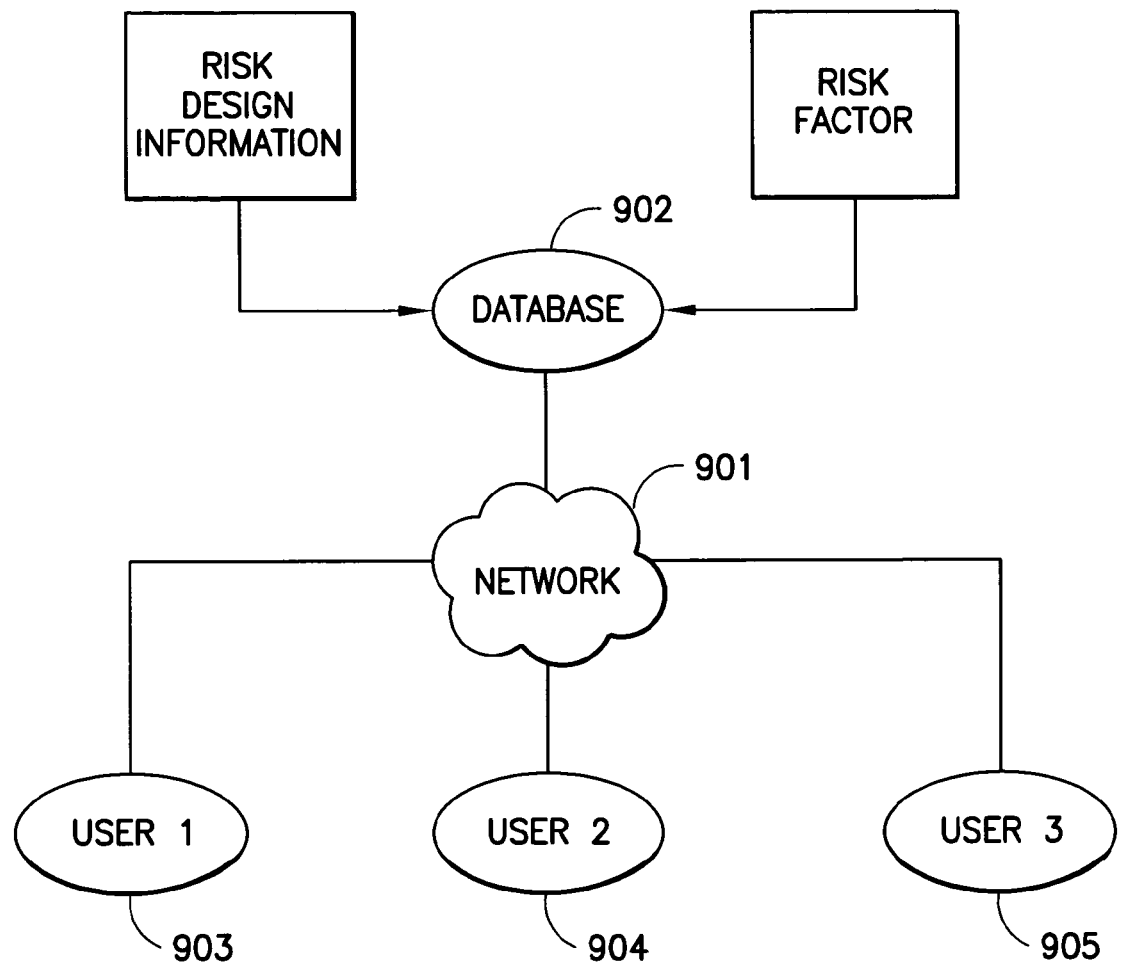
FIG. 9 is a block diagram of a network implementation of the present invention.

FIG. 9 illustrates that the present invention may be practiced by use of a network 901 such as the internet, an intranet, or any other distributed communication system. A database 902 at a first location is populated with data derived from product design information and risk factors as previously described, which is made available through the network 901 to various users 903, 904, 905. In one implementation, the various users 903, 904, 905 may be different inspection and/or evaluation stations within a contiguous manufacturing plant. In another embodiment, the various users 903, 904, 905 may be different manufacturers at different physical locations each producing an arrayed product such as an IC from the same or slightly varying design, wherein common design data are made available to each competing manufacturer 903, 904, 905 by the same database. For example, a maker of IC fabrication or testing equipment may maintain the database 902 for simultaneous use by its customers, whom are the users 903, 904, 905 that manufacture ICs. The database may include design data and/or risk factors, and may allow feedback from the various users 903, 904, 905 to continually update the risk factors and weights associated therewith.

A parallel implementation to that described in reference to FIG. 9 is a computer program embedded on a medium such as a CD-ROM, zip-disk, or hard drive. Such a computer program would include a first program code segment that includes design data, a second program code segment that includes risk factor data, and a third program code segment that allows for the input of actual defect data for historical purposes. Preferably, the actual defect data input into the computer program would modify the risk factor data in the second program code segment, either directly or in a separate program segment that calculates and stores modified risk factor data while leaving intact a copy of the unmodified risk factor data. Such a computer program could be provided to the manufacturers 903, 904, 905 to use the same relevant database information without a network 901, without departing from the teachings or claims of the present invention.

Correlation of the design shape with the shape that is seen at the inspection tool is possible with the present invention. An image of a defect is not necessary to identify risk in a certain region. Instead, what is desired is an understanding of the limitation of the resolution at each inspection tool in order to understand the meaning of defect location. If the resolution of a particular tool is, for example, +/−3 microns, then the location of a particular defect at location (x, y) is known to (x+3 microns/x−3 microns, y+3 microns/y−3 microns). Since the resolution is imperfect, the information contained in the design shapes within this entire region can be used to correlate with the defect location provided by the tool. For some types of tools, this may be accomplished by calculating the metal fraction within the region around the defect. For other types of tools, the locations (x y) of regions with observed differences in scattering images between circuits can be input to the design information.

The present invention utilizes an algorithm to define the killer, or catastrophic, potential of a flaw/defect on each layer. This algorithm takes into account feedback from electrical test data in order to build a learning process into the system to update the killer probabilities. The electrical test data consists of a determination of whether a circuit is good or bad (a list). The three distinct stages in the process of incorporating the electrical test data are:

(1) In the initial stage, before any electrical test data is available on any product in the specified technology, yield prediction can be done with the existing probabilities of fail (that is, the ones that are currently in the system). The data is then stored. The storage is typically on a computer-readable medium that can be downloaded to a desired memory or storage location and then further processed.

(2) After electrical test data is available, the following procedure is employed to obtain the killer probabilities:

(a) Employ Statistical Model 1. This model is used after defect review (see FIG. 5). In this model, for each circuit, the following defect information is used: defect type, defect size, defect location risk, level of all defects on the circuit, and whether the circuit is dead.
   Then a model is fit to the data, such as by maximum likelihood estimation (MLE).
   Then different risk functions are used to see which gives the best model.

(b) Employ Statistical Model 2. This model is used after wafer inspection but before defect review (see FIG. 6). This model is similar to Statistical Model 1, but it does not use defect type because the defects have not yet been classified.
   This model is derived from the first model, and in this case, the modeling is done outside the tool, but the resulting coefficients can be used inside the tool to calculate probabilities of fail.
   The assimilation of information or "learning" happens much faster if the defect data is collected and classified on test structures, instead of solely on product circuits, because better correlations between defect and electrical data can be obtained in a shorter amount of time.

(3) When a new product is introduced in the specified technology, the relationship between risk and circuit failure derived in the models above is then applied (i.e., the new circuit design data is used to generate a new risk map).

Using data relating to defect size, type, and location information and circuit design data, the present invention facilitates identification of risky defects, defects that lie in risky regions of the circuit and therefore can be potential circuit-killers. The degree of risk can be taken to be metal fraction or critical area in a region around a defect. With this information, this invention further provides a more accurate prediction of individual circuit survival and wafer yield.

Another advantage of the present invention is reduced variance of inline wafer yield prediction. This has applications in wafer disposition (i.e. determining which wafers to send to scrap/rework/failure analysis); determining number of wafer starts needed to meet customer commitments; and comparing actual yield with benchmarks.

Yet another advantage of the present invention is improved prediction of individual circuit survival. This applies particularly to spatial signatures of bad circuits on a wafer, to be correlated with spatial signatures of other inline measurement or tools.

The present invention has the advantage of faster diagnosis of dead circuits by failure analysis because every individual defect is assigned a probability of killing the circuit, for each circuit that does fail it is possible to rank the defects in terms of likelihood of being responsible for that fail. This facilitates the work of failure analysis engineers, who may start the analysis by looking at the most likely culprits first, based on the assigned probability of killing the circuit.

The present invention facilitates a better understanding of the effect of defect types, sizes, and locations on failure rates and statistics. A statistical model may be generated that relates the defect type and local design information of a defect to risk, or location risk, of its killing the circuit. The introduction of a location risk enables one to clearly separate effects of location and size. The model can be continuously refined as feedback is provided. This has the additional benefit of improving engineers' understanding of the relative degree risk for categories of defects, leading to better prioritization of the efforts to eliminate them.

The foregoing detailed description set forth various embodiments of the present invention via the use of block diagrams, flowcharts, and examples. It will be understood by those within the art that each block diagram component, flowchart step, and operations and/or components illustrated by the use of examples can be implemented, individually and/or collectively, by a wide range of hardware, software, firmware, or any combination thereof. In one embodiment, the present invention may be implemented via software running on a computer. However, those skilled in the art will recognize that the embodiments disclosed herein, in whole or in part, can be equivalently implemented in ASICs, standard Integrated Circuits, as a computer program running on a computer, as firmware, or as any combination thereof. Furthermore, designing the circuitry and/or writing the code for the software or firmware should be well within the skill of one of ordinary skill in the art, in light of the foregoing teachings.

The foregoing described embodiments depict different components contained within, or connected with, different or other components. Such depicted architectures are merely exemplary, and that in fact many other architectures can be implemented which achieve the same functionality. One skilled in the art will appreciate that any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Similarly, any two components so associated can also be viewed as being "operably connected", or "operably coupled", to each other to achieve the desired functionality.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that if a specific number of an introduced claim element is intended, such an intent will be explicitly recited in the claim, and in the absence of such recitation no such limitation is present. For non-limiting example, as an aid to understanding, the following appended claims may contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use of definite articles.

While the present invention has been described in terms of a wafer inspection process and apparatus, it is also contemplated that the invention described herein also applies to other testing and sampling methods and apparatus. The present invention may be used to efficiently analyze and/or inspect any product that defines an array of components, not necessarily the electrical components of integrated circuit chips. For example, the present invention may be employed to advantage in evaluating complex optical circuits, micro-capillary arrays such as are used for genetic coding and research, flat panel displays that may have arrays of electro-optical or electro-chemical components, and arrays of nano-scale devices that may each be mechanical, optical, electrical, or a combination thereof. Additionally, the present invention may be used for the evaluation of three-dimensional devices, wherein analysis and inspection may be performed on each or select layers during manufacture that are not subject to inspection or localized testing in a finished three-dimensional product. Additionally, the present invention may be used for the finished three-dimensional device. For example, certain flat panel displays comprise numerous and varied layers that operate in harmony. The present invention may be used to associate a prevalent product defect to, for example, an occlusion at a particular layer interface by using the design data. The above various and diverse examples should make clear that the above teachings are exemplary, and are not to be construed in a limiting sense upon the practice of this invention.

What is claimed is:

1. A method comprising:
    obtaining circuit design data for at least one mask level;
    correlating design shapes of the circuit design data to the at least one mask level;
    from the correlated design shapes, generating a risk map for the at least one mask level that identifies risk factors specific to locations of the design shapes;
    defining a statistical model that determines, for any individual defect, a probability that the individual defect will render a chip inoperable as a function of defect parameters and value of a risk factor of the risk map corresponding to a location of the individual defect;
    measuring defects and their parameters and locations on the at least one mask level of selected chips;
    measuring operability of the selected chips;
    fitting the statistical model to the measured defect parameters, corresponding values of risk factors of the risk map, and measured chip operability;
    from the fitted statistical model, determining a probability of a chip made from the circuit design data to be rendered inoperable; and
    based on the determined probability, taking corrective action on the chip or its fabrication process.

2. The method of claim 1, wherein the statistical model comprises a separate risk map for each mask level of the chip.

3. The method of claim 1, wherein the statistical model comprises a risk map for only a single mask level.

4. The method of claim 1, wherein the defect parameters include defect size and defect classification.

5. The method of claim 1, wherein generating the risk map comprises using historical failure analysis data, said historical failure analysis data comprising a list of defects that were established as a cause of chip failure, and information regarding at least one selected parameter of a plurality of parameters of defects in the list that were established as a cause of chip failure.

6. The method of claim 1, further comprising, after determining the probability of a chip made from the circuit design data to be rendered inoperable:
    measuring the chip for operability; and
    updating the statistical model using the results of measuring the chip for operability when said results disagree with the determined probability of the chip being rendered inoperable.

7. The method of claim 1, wherein at least one of the design shapes is defined by a critical area.

8. The method of claim 1, wherein at least one of the design shapes is defined at least in part by a metal fraction of the chip.

9. The method of claim 1, wherein at least one of the design shapes is defined by a circuit that overlaps one of the measured defect locations.

10. The method of claim 1, wherein the corrective action comprises further inspecting the chip.

11. The method of claim 1, wherein measuring defects comprises preferentially inspecting locations of the selected chips corresponding to elevated risk factors to discover defects.

12. A computer readable medium embodying a computer program adapted to execute actions for evaluating a chip, the actions comprising:
    receiving circuit design data for at least one mask level;
    correlating design shapes of the circuit design data to the at least one mask level;
    from the correlated design shapes, generating a risk map for the at least one mask level that identifies risk factors specific to locations of the design shapes;
    defining a statistical model that determines, for any individual defect, a probability that the individual defect will render a chip inoperable as a function of defect parameters and value of a risk factor of the risk map corresponding to a location of the individual defect;

using measured defects and their parameters and locations on selected chips, fitting the statistical model to the measured defect parameters, corresponding values of the risk factors of the risk map, and measured operability of the selected chips;

from the fitted statistical model, determining a probability of a chip made from the circuit design data to be rendered inoperable; and based on the determined probability, outputting a list of corrective action to be taken on the chip or on its fabrication process.

13. The computer readable medium of claim 12, wherein the statistical model comprises a separate risk map for each mask level of the chip.

14. The computer readable medium of claim 12, wherein the statistical model comprises a risk map for only a single mask level.

15. The computer readable medium of claim 12, wherein the defect-parameters include defect size and defect classification.

16. The computer readable medium of claim 12, wherein generating the risk map comprises using historical failure analysis data accessible by the computer program, said historical failure analysis data comprising a list of any defects that were established as a cause of chip failure, and information regarding at least one selected parameter of a plurality of parameters of any defects in the list that were established as a cause of chip failure.

17. The computer readable medium of claim 12, further comprising, after determining the probability of a chip made from the circuit design data to be rendered inoperable:

updating the statistical model using results of measuring the chip for operability when said results disagree with the determined probability.

18. The computer readable medium of claim 12, wherein at least one of the design shapes is defined by a critical area.

19. The computer readable medium of claim 12, wherein at least one of the design shapes is defined at least in part by a metal fraction of the chip.

20. The computer readable medium of claim 12, wherein at least one of the design shapes is defined by a circuit that overlaps one of the measured defect locations.

21. The computer readable medium of claim 12, wherein the list comprises preferential inspection locations on the chip.

22. The computer readable medium product of claim 12, wherein the measured defects arise from preferentially inspecting locations of the selected chips corresponding to elevated risk factors.

* * * * *

UNITED STATES PATENT AND TRADEMARK OFFICE
CERTIFICATE OF CORRECTION

| | | |
|---|---|---|
| PATENT NO. | : 7,346,470 B2 | Page 1 of 1 |
| APPLICATION NO. | : 10/459132 | |
| DATED | : March 18, 2008 | |
| INVENTOR(S) | : Lanzerotti et al. | |

It is certified that error appears in the above-identified patent and that said Letters Patent is hereby corrected as shown below:

On Title Page Item (12), please delete "Wisniewski" and replace with --Lanzerotti--.

On Title Page Item (75), please delete "Mary Wisniewski" and replace with --Mary Lanzerotti--.

Signed and Sealed this

Sixteenth Day of December, 2008

JON W. DUDAS
*Director of the United States Patent and Trademark Office*